United States Patent
Rajwade et al.

(10) Patent No.: US 12,322,455 B2
(45) Date of Patent: Jun. 3, 2025

(54) PROGRAM VERIFY PROCESS HAVING PLACEMENT AWARE PRE-PROGRAM VERIFY (PPV) BUCKET SIZE MODULATION

(71) Applicant: Intel NDTM US LLC, Santa Clara, CA (US)

(72) Inventors: Shantanu R. Rajwade, Santa Clara, CA (US); Tarek Ahmed Ameen Beshari, Santa Clara, CA (US); Matin Amani, Fremont, CA (US); Narayanan Ramanan, San Jose, CA (US); Arun Thathachary, Santa Clara, CA (US)

(73) Assignee: Intel NDTM US LLC, Santa Clara, CA (US)

( * ) Notice: Subject to any disclaimer, the term of this patent is extended or adjusted under 35 U.S.C. 154(b) by 786 days.

(21) Appl. No.: 17/321,114

(22) Filed: May 14, 2021

(65) Prior Publication Data

US 2022/0366991 A1    Nov. 17, 2022

(51) Int. Cl.
*G11C 16/34* (2006.01)

(52) U.S. Cl.
CPC ............... *G11C 16/3459* (2013.01)

(58) Field of Classification Search
CPC .................................................. G11C 16/3459
USPC ...................................................... 365/185.22
See application file for complete search history.

(56) References Cited

U.S. PATENT DOCUMENTS

| | | | |
|---|---|---|---|
| 9,373,390 B1 * | 6/2016 | Lee ..................... | G11C 16/3459 |
| 10,061,516 B2 * | 8/2018 | Wakchaure ............. | G06F 3/064 |
| 10,643,720 B2 * | 5/2020 | Yang ...................... | G11C 16/24 |
| 11,842,792 B2 * | 12/2023 | Lin ....................... | G11C 7/1084 |
| 2008/0239806 A1 * | 10/2008 | Moschiano .......... | G11C 11/5628 |
| | | | 365/185.23 |
| 2024/0177784 A1 * | 5/2024 | Choi ...................... | G11C 16/08 |
| 2024/0203512 A1 * | 6/2024 | Liu ......................... | G11C 16/10 |

* cited by examiner

*Primary Examiner* — Connie C Yoha
(74) *Attorney, Agent, or Firm* — Morgan, Lewis & Bockius LLP

(57) ABSTRACT

An apparatus is described. An apparatus includes controller logic circuitry to perform a program-verify programming process to a flash memory chip. The program-verify programming process is to reduce a size of a pre-program verify (PPV) bucket in response to a number of cells being fully programmed to a same digital state. The number of cells are less than a total number of cells to be programmed to the same digital state.

20 Claims, 8 Drawing Sheets

PROGRAM VERIFY PROCESS HAVING PLACEMENT AWARE PRE-PROGRAM VERIFY (PPV) BUCKET SIZE MODULATION

FIELD OF INVENTION

The field of invention pertains generally to the electronic arts, and, more specifically, to a program verify process having placement aware pre-program verify (PPV) bucket size modulation.

BACKGROUND

With the onset of "big-data", cloud-computing, artificial intelligence and other highly data intensive applications, the performance of storage devices is becoming an increasing focus of overall application performance. As such, systems designers and mass storage device designers are becoming increasingly focused on improving the performance of their mass storage devices.

FIGURES

A better understanding of the present invention can be obtained from the following detailed description in conjunction with the following drawings, in which.

Figure 3:
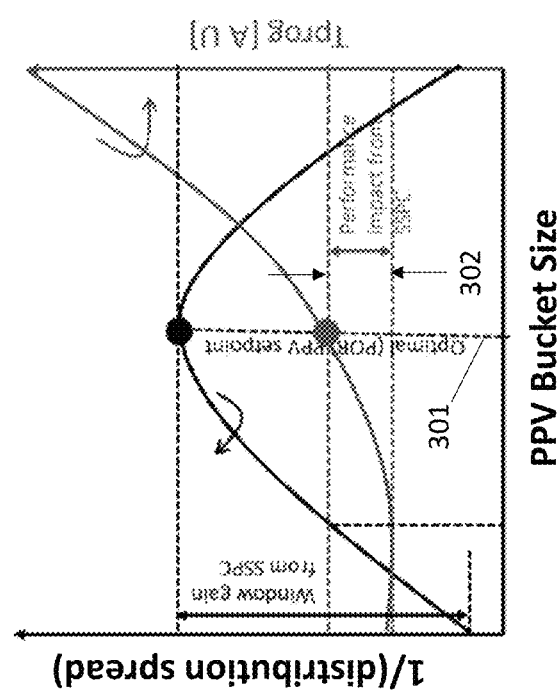
Figure 4:
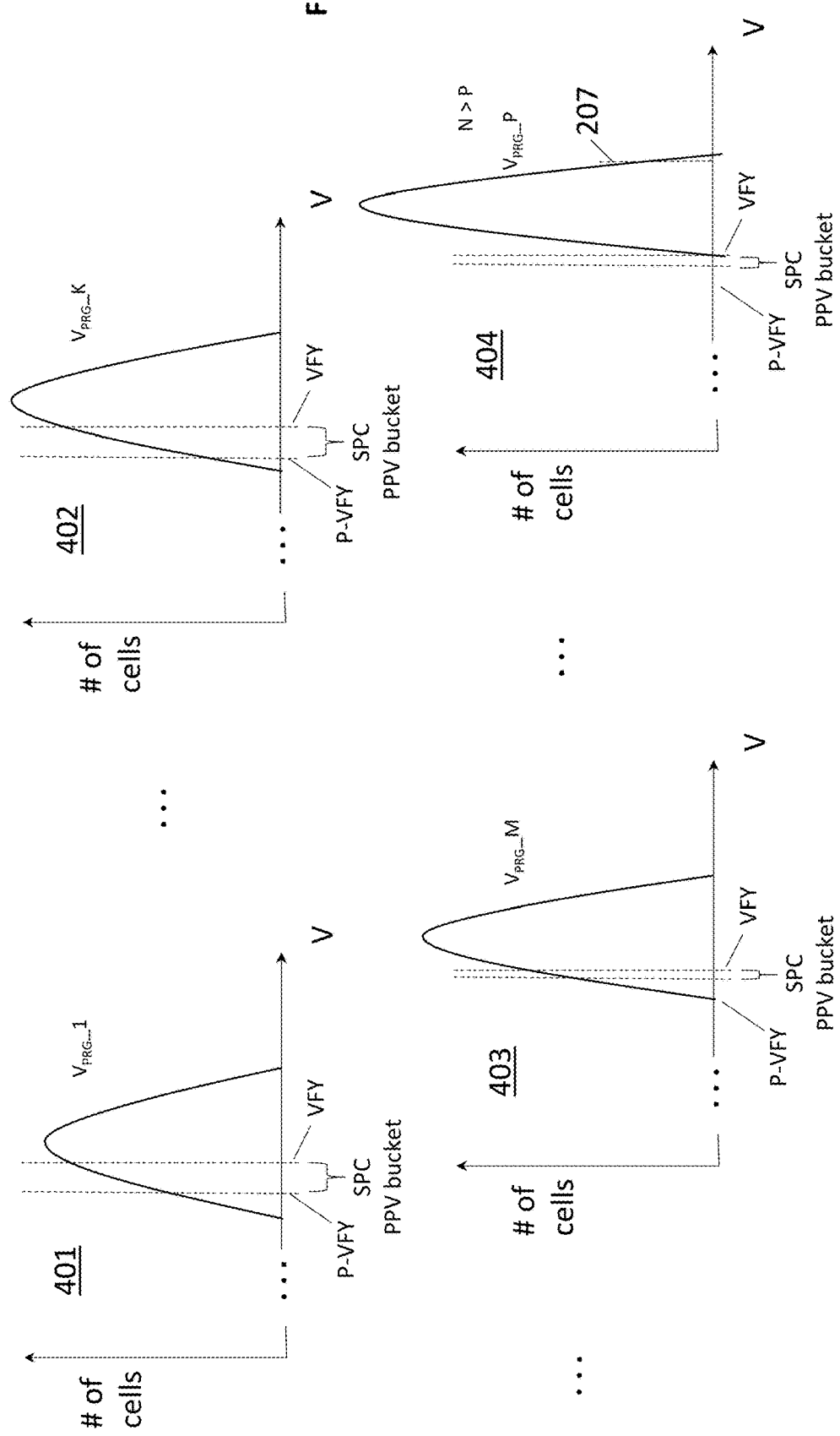
Figure 5:
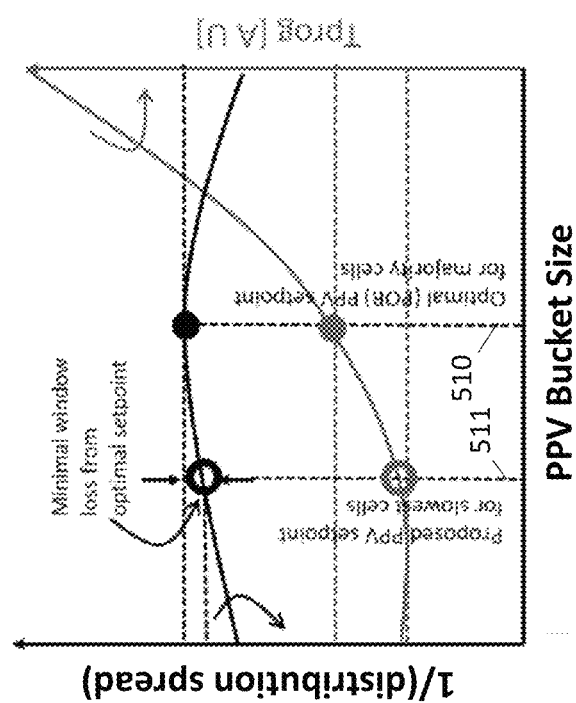
Figure 6:
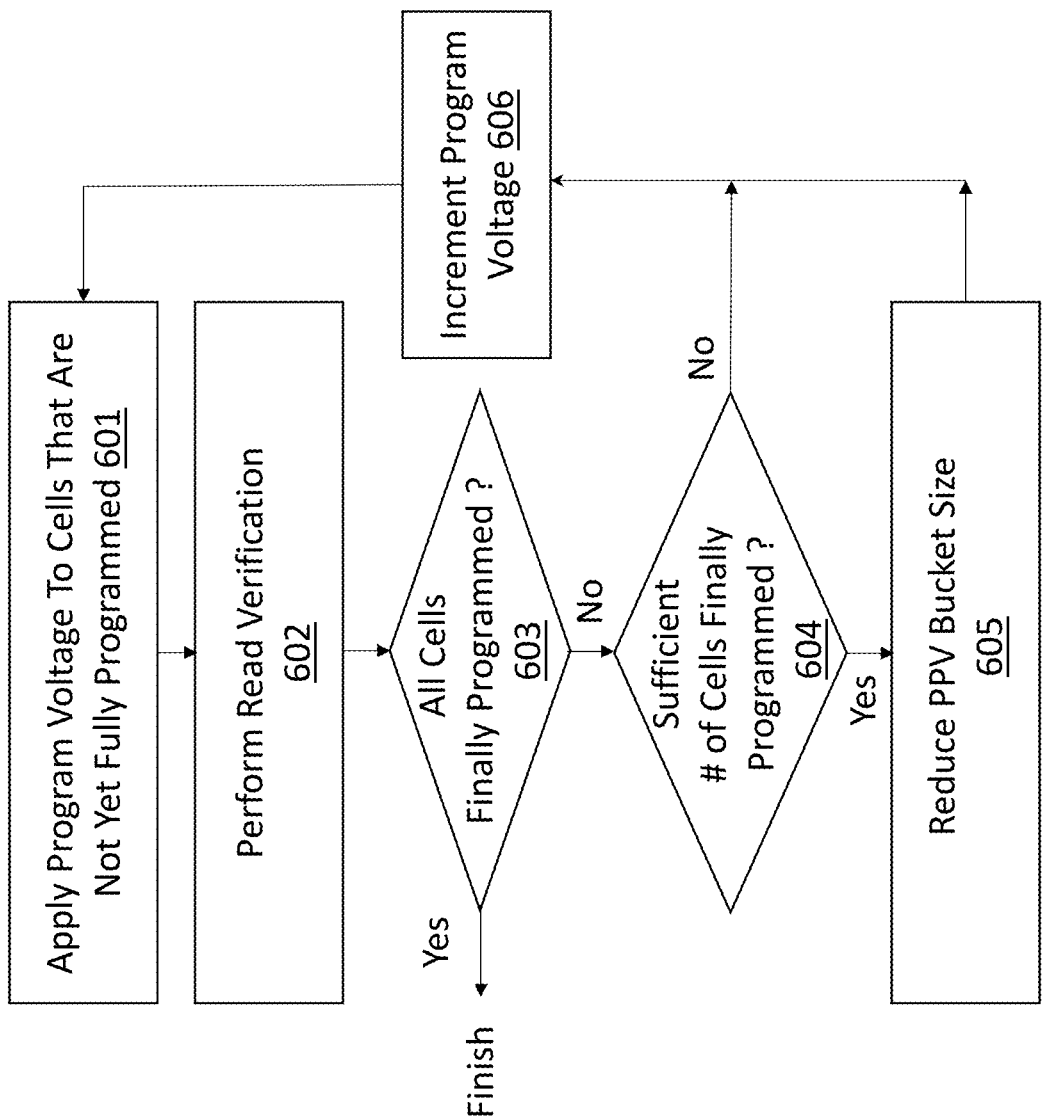
Figure 7:
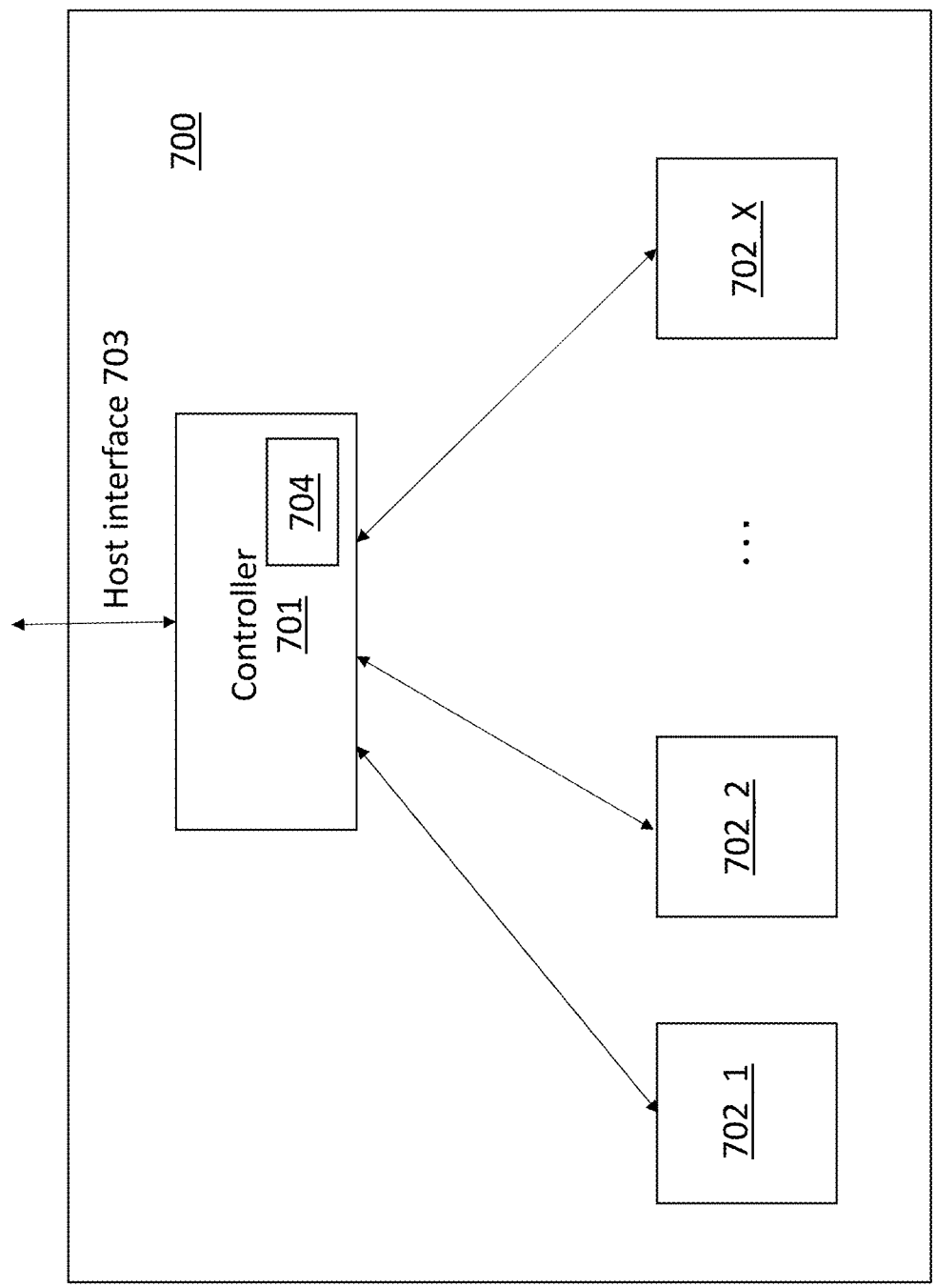
Figure 8:
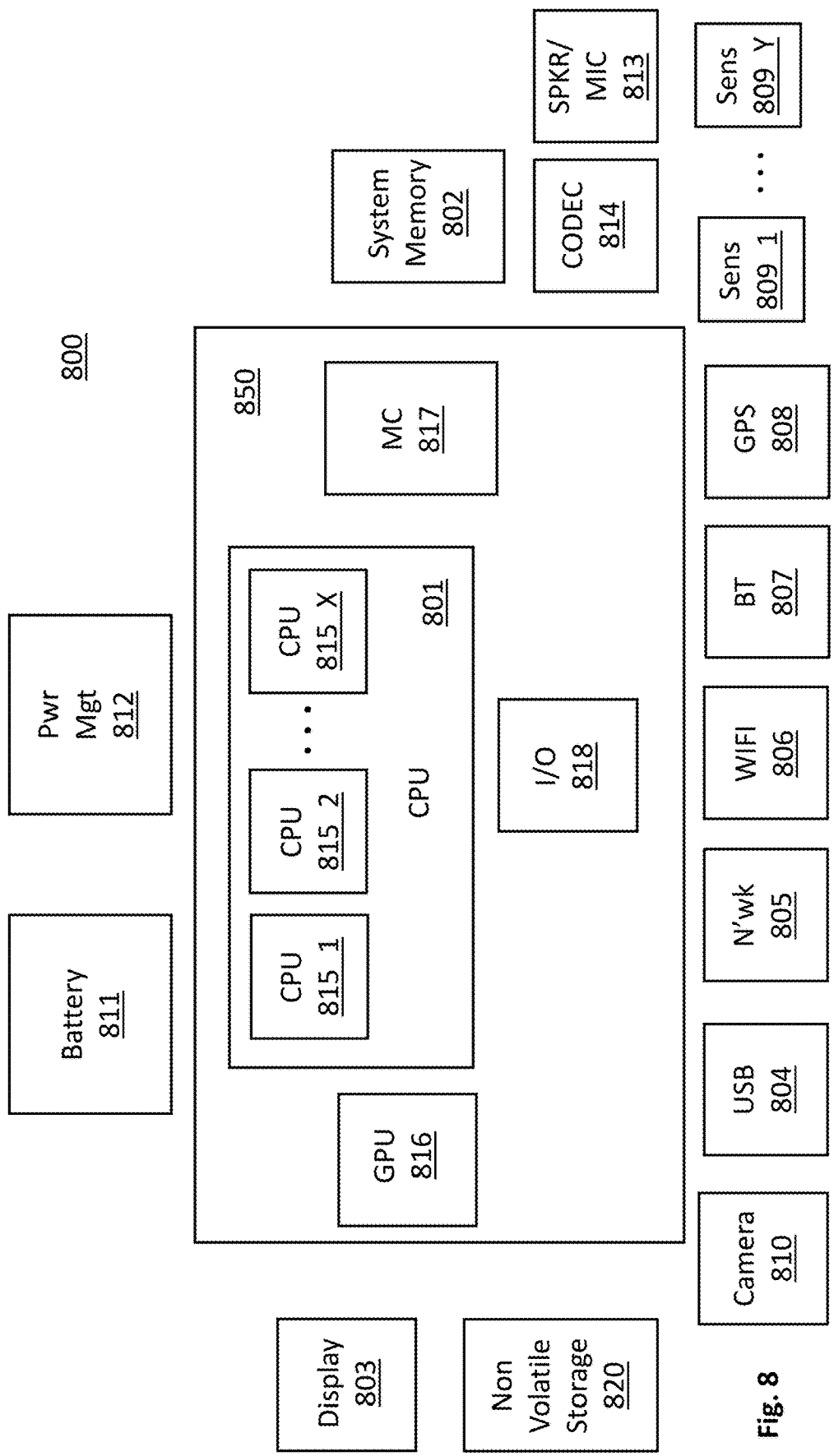

FIG. 3 graphically depicts the prior art program-verify process;

FIG. 4 shows an improved program-verify process;

FIG. 5 graphically depicts the improved program-verify process;

FIG. 6 shows a flow diagram of the improved program-verify process;

FIG. 7 shows a storage device;

FIG. 8 shows a computer system.

DESCRIPTION

Figure 1:
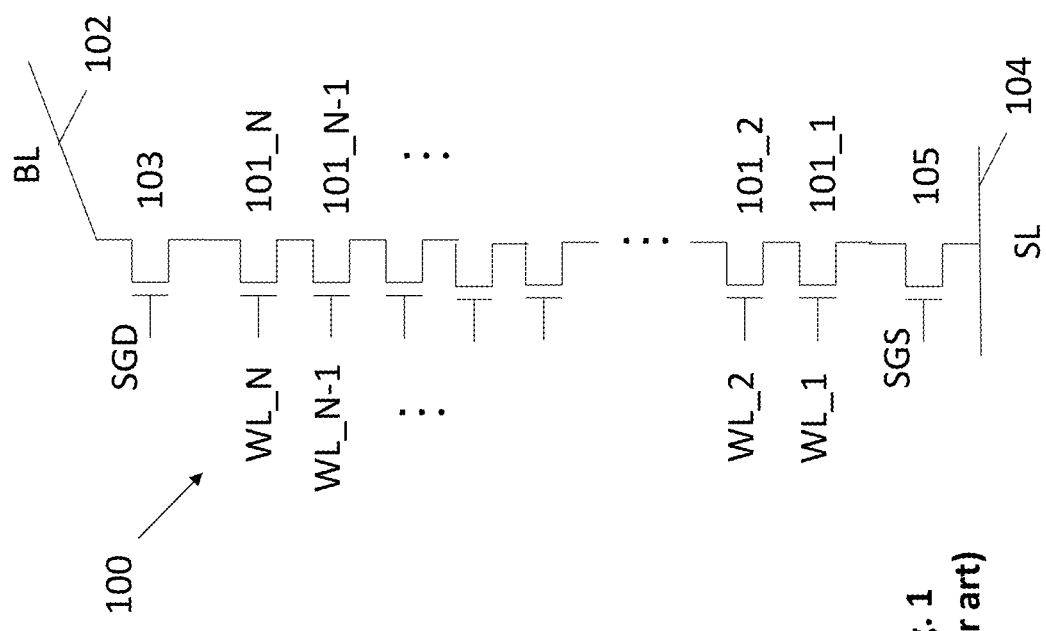
FIG. 1 shows a prior art column of flash memory cells.

FIG. 1 shows a stack of flash memory cells 100. As observed in FIG. 1, the stack 100 of flash cells includes N transistors 101_1 through 101_N coupled along a vertical column whose respective gate structures correspond to individual storage elements. The column is accessed on the top side via a bit line (BL) 102 and select-gate-drain (SGD) transistor 103. Bias potentials are applied to the column through a bottom side source line (SL) 104 and a select-gate-source (SGS) transistor 105. Here, bottom is understood to mean closer to the semiconductor chip substrate and top is understood to mean farther away from the semiconductor chip substrate.

As is known in the art, flash memory is written to (technically referred to as "programming") in units of pages. A single block includes an array of flash cell stacks, where, storage cells residing at a same vertical position are tied to a same word line. When reading from or writing to a particular page of information within a block, a particular word line in the block is activated which, in turn, activates the cells of the various stacks that are coupled to that word line.

In the case of a read, the respective charges stored in the cells that are coupled to the activated word line influence the potential on their respective columns and bit lines which are then sensed to determine the read information (the cells that are not coupled to the activated word line are trivialized/shorted with respect to their respective columns).

Here, commonly, a single flash cell is capable of storing more than two digital states to effect storage of more than one bit per cell. For example, in the case of quad level cell (QLC), each cell is capable of storing sixteen different charge levels which, in turn, corresponds to the storage of four digital bits per cell.

In order to successfully store multiple charge levels per cell, the distribution of charge amongst the cells needs to be fairly tight or precise for a same stored digital value. That is, if a number of flash cells are to store a same digital value, their respective stored charges should be nearly identical (there is a narrow charge spread amongst them). If it were otherwise, it would be difficult if not impossible to read and write multi-state values into many different storage cells.

Figure 2:
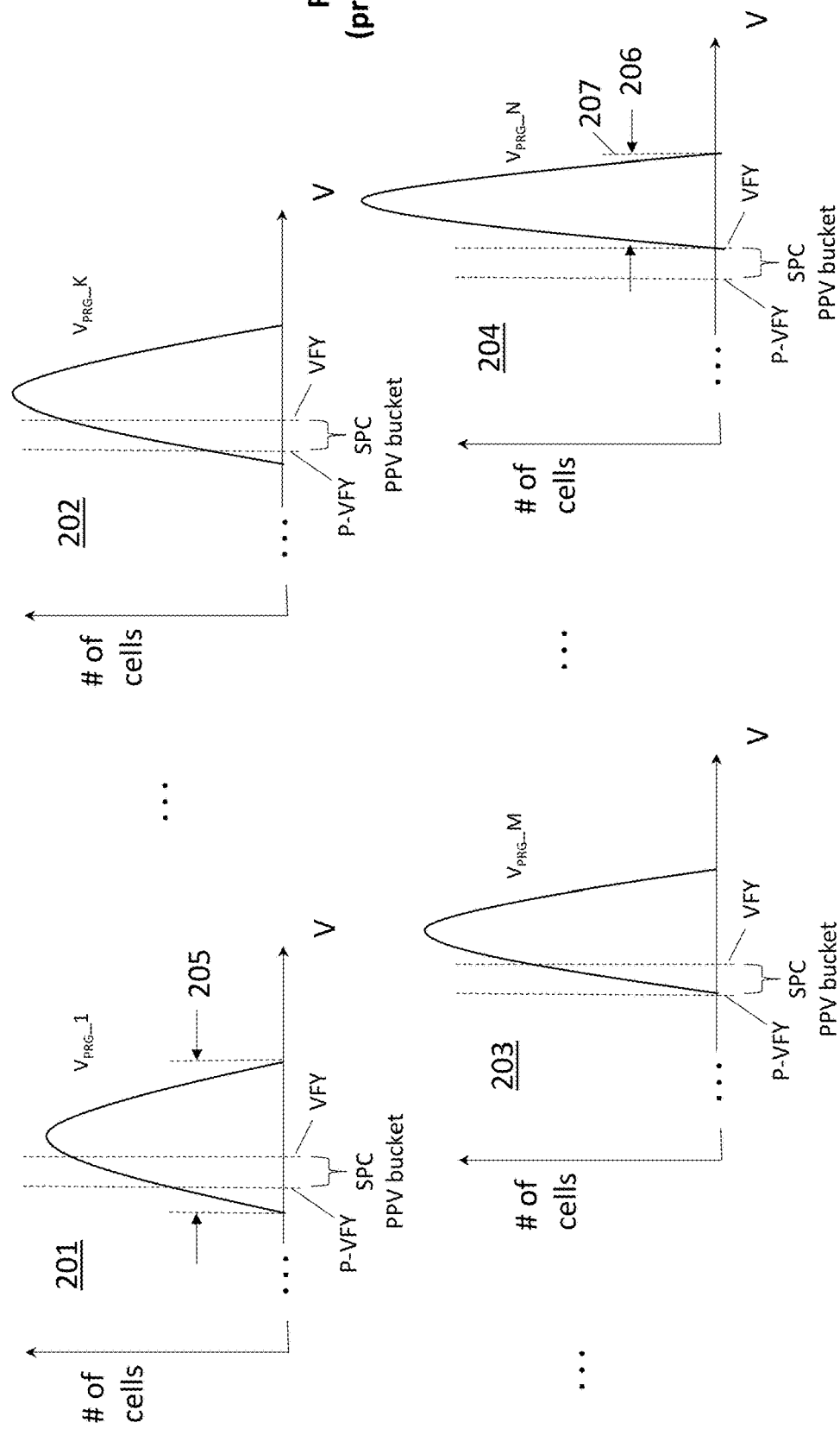
FIG. 2 shows a prior art program-verify process.

FIG. 2 shows a prior art method for programming flash cells. Here, cells that are coupled to a same word line (a page) are concurrently programmed. Commonly, only a subset of the cells that are coupled to a same word line are programmed to the same digital state (e.g., each of the multiple digital states that any cell can store is separately programmed into a different, exclusive set of cells that are tied to the same word line).

In order to charge a subset of cells to a same digital state, a same bit line voltage is initially applied to the cells of the subset. Thus, for example, the bit line of each cell that is coupled to the word line whose cells are being programmed is initially charged with a voltage that corresponds to the particular digital state that the cell is to be programmed to. Then, a first program voltage is applied to the word line. The application of the program voltage couples each cell to its corresponding bit line which, in turn, causes the cell to store an amount of charge that is proportional to its bit line's voltage.

FIG. 2 shows resultant charge distributions for a subset of cells that are being programmed to a same digital state. Inset 201 shows the resultant charge distribution after a first program voltage ($V_{PRG\_1}$) is applied to the word line.

As can be seen, the cells have different responsivities to the same applied program and bit line voltages. That is, some cells store less charge from their respective bit line (left hand side of distribution) while other cells store more charge from their respective bit line (right hand side of distribution). The different responsivities result in a wide spread 205 of stored charge amongst the cells.

Here, a repetitive "program-verify" process is used by which, after cells are programmed with a first set of program and bit line voltages, each of the cells is individually read from to determine whether that cell is storing sufficient charge for the particular digital state it is being programmed to. As such, there exists a corresponding verify voltage ("VFY") for each different digital state being programmed. Those cells in the distribution whose stored charge generates a read voltage that surpasses VFY are deemed to store sufficient charge and are no longer programmed.

By contrast, those cells in the distribution whose stored charge does not generate a read voltage that surpasses VFY are deemed weak and are re-programmed with an incremenetally higher word line voltage during a subsequent program-verify sequence.

Thus, referring to inset 201, after verification of the first programming sequence (word line voltage=$V_{PRG\_1}$), cells whose read voltage are to the right of VFY are deemed to be properly programmed, whereas, cells whose read voltage to the left of VFY are deemed to be weak and need re-programming with a higher word line voltage ($V_{PRG\_2}=V_{PRG\_1}+\Delta V_{PRG}$).

Additionally, the weak cells whose read voltage falls to the left of VFY in inset 201 are separate into two different groups. Those that "just missed" VFY and those that did not "just miss" VFY. Here, a second verification read voltage threshold (pre-verify (P-VFY)) is used to delineate between the two. That is, those cells whose verification read voltage is above P-VFY but beneath VFY are deemed to have "just missed" VFY, whereas, those cells whose verification read voltage is beneath P-VFY are deemed to not have "just missed" VFY. The "just missed" cells are said to fall within a pre-program verify (PPV) bucket.

During the next program step, both the "just missed" and the "not just missed" cells are programmed with a next, elevated program voltage ($V_{PRG\_2}=V_{PRG\_1}+\Delta V_{PRG}$) applied to the word line. However, the bit lines of the cells that "just missed" VFY are provided with a bit line voltage that is slightly larger than the nominal bit line voltage ($V_{BL}$) for the digital state being programmed. That is, whereas the bit lines of the cells that did not just miss VFY are provided with a voltage $V_{BL}$, by contrast, the bit lines of the cells that just missed VFY are provided with a voltage $V_{BL}+\Delta V$.

Applying larger bit line voltage to cells that just missed VFY as of the last program step, a technique referred to as selective slow programming convergence (SSPC), lessens the responsivity of these cells for the next program step (the application of the slightly larger bit voltage weakens the programming effect because electrons are driven with less strength into their respective storage cells). By so doing, such cells will only store small amounts of charge and only weakly surpass VFY. This has the effect of narrowing the final stored charge distribution.

Those cells that did not just miss VFY as of the last program step are provided the normal programming $V_{BL}$ bit line voltage during the next program step and will therefore store more charge during the next program step.

The program-verify process then iterates (with each next program step using an incrementally higher program voltage on the word line and just missing cells receiving slightly more bit line voltage than cells that did not just miss VFY as of the prior program step) until all cells surpass VFY, at which point, the programming of the particular stored state is deemed complete.

Insets 202, 203 and 204 depict the charge distribution results of the cells after successive iterations of the programming sequence. Here, inset 202 depicts the resultant distribution after the Kth iteration. As can be seen, progressively more cells have stored charge that surpass VFY than after the initial program step 201. Inset 203 depicts the resultant distribution after the Mth iteration (M>K). Inset 204 depicts the resultant distribution after the Nth iteration (N>M). As can be seen, as of the verification of the Nth iteration, all cells surpass VFY and the programming of the particular state being programmed is deemed complete. Notably, at least in part to the SSPC approach, the total spread of the distribution narrows from the first program step 205 to the final program step 206.

A problem however is the time consumed programming the cells because of the SSPC approach. Essentially, deliberately charging cells with less charge per iteration once they are near (but have not yet reached) VFY increases the number of iterations needed to fully program the group of cells. The problem is exacerbated with respect to the programming of the weakest sensitivity cells. Such cells commonly enter the PPV bucket before finally surpassing the minimal VFY read voltage level. In this case, the weakest cells are receiving the lesser amount of charge per program-verify iteration which, in turn, significantly expands the total number of program-verify operations needed to fully program all of the cells.

Part of the problem in the prior art approach of FIG. 2 is the fact that the size of the PPV bucket remains constant throughout the programming process of a given state. That is, as observed in FIG. 2, the PPV bucket maintains the same size for each of the iterations.

Here, a reasonably larger PPV bucket translates into programming precision in the sense that more cells will barely surpass VFY which, in turn, results in a narrower final distribution spread 207. However, keeping the PPV bucket large also has the effect of capturing more of the weakest cells in the PPV bucket. This, in turn, drastically increases the number of iterations needed to complete programming because a significant number of the weakest cells are provided the lesser amount of charge per iteration once they are within the PPV bucket.

FIG. 3 shows the problem graphically. Here, as can be seen, the time to program a group of cells to a same digital state increases dramatically with increased PPV bucket size. As observed in FIG. 3, the prior art approach keeps the bucket size constant which corresponds to a single operating point 301 that minimizes distribution width but consumes a significant amount of time 302 charging (perhaps all) of the weakest cells with the larger (weaker) SSPC voltage.

A solution is to optimize the size of the PPV bucket so that the desired narrowing of the distribution is mostly achieved but without the cost of dramatically longer program times. Here, according to various approaches, programming commences with a larger optimized (e.g., prior art) PPV bucket size. The larger PPV bucket size is maintained through a number of following program-verify iterations until a sufficiently large number of cells have been fully programmed (surpass VFY). This achieves narrow final distribution. That is, large numbers of weaker cells have been programmed according to the SSPC approach which, in turn, translates into large numbers of the weaker cells having a final verify read voltage that barely surpasses VFY.

However, once a sufficiently large number of cells have been fully programmed, the PPV bucket size is reduced. This achieves shorter total programming time without sabotaging the (already achieved) narrower distribution. Here, shorter programming time is achieved because the last remaining (weakest) cells avoid SSPC.

That is, with a reduced PPV bucket size, the weakest cells are most likely not captured by the PPV bucket. As such they receive the larger amount of charge per program-verify iteration and consume less iterations to complete (surpass VFY) than they otherwise would have consumed if they had received the lesser (SSPC) amount of charge per iteration as per the prior art approach. In essence, as compared to the prior art approach, the number of iterations needed to program the cells that consume the most iterations is lessened.

Programming cells with a larger charge amount per iteration closer to the VFY threshold (an artifact of reducing the size of the PPV bucket) has some risk of causing such cells to be finally programmed with more charge (farther to the right of the VFY threshold) than they otherwise would have been finally programmed with if the bucket size had not been reduced and they were programmed according to SSPC. This has the effect of widening the final distribution. However, because only a small percentage of the total number cells (e.g., the last few weakest cells) will store a larger final charge amount than they otherwise would have, the overall distribution, including its width, is not affected much.

FIG. 4 shows the improved approach. As can be seen, by the time of the Mth program-verify iteration (inset 403), the size of the PPV bucket has been reduced. The total number of iterations needed to complete programming (inset 404) is less than the prior art approach of FIG. 2 (the approach of FIG. 2 consumes N total iterations whereas the improved approach of FIG. 4 consumes only P total iterations (N of FIG. 2 is greater than P of FIG. 4). The width of the final distribution observed in inset 404 is only slightly wider than the width of the final distribution 207 observed in inset 204 of FIG. 2.

FIG. 5 depicts the approach graphically. Here, two different operating points 510, 511 are observed. A first operating point 510 uses a larger bucket size that, e.g., corresponds to the bucket size optimized/used for the prior art approach (in which bucket size remains constant). A second operating point 511 uses a smaller bucket size once a sufficient number of cells have been fully programmed. The second operating point significantly reduces the additional programming time caused by SSPC while causing only a slight increase in the width of the distribution.

FIG. 6 shows a high level flow diagram of the improved approach. As observed in FIG. 6, a program voltage is applied 601 to cells that are coupled to a same word line, are to be programmed to a same digital state and are not yet fully programmed to that digital state. The cells are then read and compared against a threshold voltage level for the digital state being stored 602. If all cells are fully programmed 603 (each cell generates a read voltage that is at least equal to the threshold voltage level) programming is complete.

If less than all cells are fully programmed 603, an inquiry is made as to whether a sufficient number of the cells have been fully programmed 604. If not, the program voltage is incremented 606 and applied to the remaining cells that are not yet fully programmed 601. If so, the PPV bucket size is decreased 605, the program voltage is incremented 606 and applied to the remaining cells that are not yet fully programmed 601.

The decision as to whether a sufficient number of the cells have been fully programmed can be implemented in any of a number of different ways. According to one approach, the decision is made explicitly, e.g., based on the number of cells that are fully programmed and/or the number of cells that have yet to be fully programmed. In other embodiments, the decision is made empirically or impliedly. For example, after the number of program-verify iterations has surpassed some threshold, and/or, whether the next lower digital state has completed programming operations, etc. In yet other embodiments, some combination of any of these factors are combined into an expression. If the expression yields a value that passes some threshold a sufficient number of cells are deemed to be fully programmed.

Commonly, to the extent there are multiple digital states that have not yet been fully programmed, the programming algorithm performs program verify-iterations until a lowest one of the digital states is fully programmed (the digital state that corresponds to the least amount of stored charge per cell). Each of these program verify-iterations are also used to concurrently program and verify the cells of higher states that are not yet fully programmed Notably, by the time a lower state is fully programmed, many of the cells of the next state have already been fully programmed (e.g., in some cases, 98% of cells being programmed to higher states are fully programmed by the time the programming of the lowest state is complete). As such, according to one approach, once the lower state is fully programmed, the PPV bucket size for the very next state is automatically reduced (or a factor for triggering the reduction of the PPV bucket size is enhanced).

In still yet other or additional embodiments, more than one PPV bucket size adjustment can be made during a sequence of program-verify operations. For example, once the number of fully programmed cells has passed a first threshold, the PPV bucket size is reduced to a first smaller size. Then, e.g., after a number of following program-verify operations have been performed and the number of fully programmed cells has passed a second threshold, the PPV bucket size is again reduced to a second even smaller size. As many reductions may be performed as is appropriate for the flash memory.

In still yet other or additional embodiments, a PPV bucket size reduction results in the elimination of the PPV bucket (and, correspondingly, future execution of the SSPC programming process).

FIG. 7 shows an exemplary storage device 700 such as a solid state drive (SSD). The SSD includes a controller 701 and multiple flash memory chips 702 (e.g., NAND flash storage chips). The controller 701 communicates with a host (e.g., a computer, a computer's peripheral control hub, etc.) through an interface 703. Exemplary interfaces include, to name a few, Non-Volatile Memory Host Controller Interface Specification (NVMe, NVMe-of, etc.), Peripheral Component Interface (PCIe), Serial ATA (SATA) and Small Computer System Interface (SCSI). The controller 701 receives read and write requests from the host and applies them to the memory chips 702. The controller 703 includes logic 704 to implement to the programming approach described above. The logic 703 can be composed of firmware, hardware or a combination of both. In the case of firmware, the controller 703 includes logic circuitry to execute the firmware program code instructions and can also include local memory to store the firmware program code instructions. In the case of hardware, the controller 703 includes various other kinds of logic circuitry such as dedicated hardwired circuitry, programmable circuitry, etc.

FIG. 8 provides an exemplary depiction of a computing system 800 (e.g., a smartphone, a tablet computer, a laptop computer, a desktop computer, a server computer, etc.). As observed in FIG. 8, the basic computing system 800 may include a central processing unit 801 (which may include, e.g., a plurality of general-purpose processing cores 815_1 through 815_X) and the main memory controller 817 disposed on a multi-core processor or applications processor, system memory 802, a display 803 (e.g., touchscreen, flat-panel), a local wired point-to-point link (e.g., USB) interface 804, various network I/O functions 805 (such as an Ethernet interface and/or cellular modem subsystem), a wireless local area network (e.g., WiFi) interface 806, a wireless point-to-point link (e.g., Bluetooth) interface 807 and a Global Positioning System interface 808, various sensors 809_1 through 809_Y, one or more cameras 810, a battery 811, a power management control unit 812, a speaker and microphone 813 and an audio coder/decoder 814.

An application processor or multi-core processor 850 may include one or more general-purpose processing cores 815 within its CPU 801, one or more graphical processing units 816, a memory management function 817 (e.g., a memory controller) and an I/O control function 818 (also referred to as a peripheral control hub). The general-purpose processing cores 815 typically execute the system and application software of the computing system. The graphics processing unit 816 typically executes graphics intensive functions to, e.g., generate graphics information that is presented on the display 803. The memory control function 817 interfaces with the system memory 802 to write/read data to/from system memory 802.

Any of the system memory 802 and/or non volatile mass storage 820 can be composed with a three dimensional non volatile random access memory composed, e.g., of an emerging non volatile storage cell technology. Examples include Optane memory from Intel Corporation, QuantX from Micron Corporation, and/or other types of resistive non-volatile memory cells integrated amongst the interconnect wiring of a semiconductor chip (e.g., resistive random access memory (ReRAM), ferroelectric random access memory (FeRAM), spin transfer torque random access memory (STT-RAM), etc.). Mass storage 820 at least can also be composed of flash memory (e.g., NAND flash).

The mass storage 820, or conceivably even system memory 802 if composed of non volatile (e.g., flash) memory, could be implemented with non volatile memory chips that are programmed as described at length above.

Each of the touchscreen display 803, the communication interfaces 804-807, the GPS interface 808, the sensors 809, the camera(s) 810, and the speaker/microphone codec 813, 814 all can be viewed as various forms of I/O (input and/or output) relative to the overall computing system including, where appropriate, an integrated peripheral device as well (e.g., the one or more cameras 810). Depending on implementation, various ones of these I/O components may be integrated on the applications processor/multi-core processor 850 or may be located off the die or outside the package of the applications processor/multi-core processor 850. The power management control unit 812 generally controls the power consumption of the system 800.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., FPGA, PLD) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

An apparatus has been described. The apparatus includes controller logic circuitry to perform a program-verify programming process to a flash memory chip, wherein, the program-verify programming process is to reduce a size of a pre-program verify (PPV) bucket in response to a number of cells being fully programmed to a same digital state. The number of cells being less than a total number of cells to be programmed to the same digital state.

In various embodiments the number of cells are fully programmed after a sequence of program-verify iterations have been performed. In various embodiments the number of cells are fully programmed after another total number of cells to be programmed to a lower digital state are fully programmed. In further embodiments the lower digital state is the lowest digital state.

In various embodiments the controller is to reduce the size of the PPV bucket more than once per sequence of program-verify operations for the same digital state. In various embodiments the number is established from a combination of factors. In various embodiments the reduction of the size of the PPV bucket results in elimination of the PPV bucket.

A computing system has been described having a plurality of processing cores, a main memory, a peripheral control hub and a solid state drive coupled to the peripheral control hub. The solid state drive has a controller having logic circuitry as described just above.

A program-verify process has been described. The program-verify process includes applying a program voltage to a plurality of flash cells that are being programmed to a same digital state; reading from each of the flash cells to verify which ones of the flash cells are storing a sufficient amount of charge for the digital state; and, reducing a size of a PPV bucket for future program verify operations for the same digital state because a total number of flash cells that are storing the sufficient amount of charge and are to be programmed to the same digital state has reached a threshold.

In various embodiments, the threshold is reached upon a number of program-verify iterations having been performed. In various embodiments a condition for the threshold being reached is a lower digital state being fully programmed. In further embodiments the lower digital state is the lowest digital state.

In various embodiments, the process includes reducing the size of the PPV bucket more than once per sequence of program-verify operations for the same digital state. In further embodiments the reduction of the size of the PPV bucket results in elimination of the PPV bucket.

The invention claimed is:

1. An apparatus, comprising:
   controller logic circuitry to perform a program-verify programming process to a flash memory chip, wherein, the program-verify programming process is to reduce a size of a pre-program verify (PPV) bucket in response to a number of cells being fully programmed to a same digital state, the number of cells being less than a total number of cells to be programmed to the same digital state,
   wherein cells in the PPV bucket comprise cells having read voltage that is less than a first read verify voltage threshold ("VFY") corresponding to the same digital state and above a second verification read voltage threshold (pre-verify (P-VFY)) that is less than VFY.

2. The apparatus of claim 1 wherein the number of cells are fully programmed after a sequence of program-verify iterations have been performed.

3. The apparatus of claim 1 wherein the number of cells are fully programmed after another total number of cells to be programmed to a lower digital state are fully programmed.

4. The apparatus of claim 3 wherein the lower digital state is the lowest digital state.

5. The apparatus of claim 1 wherein the controller logic circuitry is configured to reduce the size of the PPV bucket more than once per sequence of program-verify operations for the same digital state.

6. The apparatus of claim 1 wherein the reduction of the size of the PPV bucket results in elimination of the PPV bucket.

7. A computing system, comprising:
a plurality of processing cores;
a main memory;
a peripheral control hub; and,
a solid state drive coupled to the peripheral control hub, the solid state drive comprising a controller, the controller comprising logic circuitry to perform a program-verify programming process to a flash memory chip, wherein, the program-verify programming process is to reduce a size of a pre-program verify (PPV) bucket in response to a number of cells being fully programmed to a same digital state, the number of cells being less than a total number of cells to be programmed to the same digital state,
wherein cells in the PPV bucket comprise cells having read voltage that is less than a first read verify voltage threshold (VFY) corresponding to the same digital state and above a second verification read voltage threshold (pre-verify (P-VFY)) that is less than VFY.

8. The computing system of claim 7 wherein the number of cells are fully programmed after a sequence of program-verify iterations have been performed.

9. The computing system of claim 7 wherein the number of cells are fully programmed after another total number of cells to be programmed to a lower digital state are fully programmed.

10. The computing system of claim 9 wherein the lower digital state is the lowest digital state.

11. The computing system of claim 7 wherein the controller is to reduce the size of the PPV bucket more than once per sequence of program-verify operations for the same digital state.

12. The computing system of claim 7 wherein the reduction of the size of the PPV bucket results in elimination of the PPV bucket.

13. A non-transitory machine readable storage medium having stored thereon program code instructions that when processed by a controller causes a controller to perform a program-verify process comprising:
applying a program voltage to a plurality of flash cells that are being programmed to a same digital state;
reading from each of the flash cells to verify which ones of the flash cells are storing a sufficient amount of charge for the digital state; and,
reducing a size of a PPV bucket for future program verify operations for the same digital state because a total number of flash cells that are storing the sufficient amount of charge and are to be programmed to the same digital state has reached a threshold,
wherein cells in the PPV bucket comprise cells having read voltage that is less than a first read verify voltage threshold (VFY) corresponding to the same digital state and above a second verification read voltage threshold (pre-verify (P-VFY)) that is less than VFY.

14. The non-transitory machine readable storage medium of claim 13 wherein the threshold is reached upon a number of program-verify iterations having been performed.

15. The non-transitory machine readable storage medium of claim 13 wherein a condition for the threshold being reached is a lower digital state being fully programmed.

16. The non-transitory machine readable storage medium of claim 13 wherein the program-verify process further comprises reducing the size of the PPV bucket more than once per sequence of program-verify operations for the same digital state.

17. The non-transitory machine readable storage medium of claim 13 wherein the reduction of the size of the PPV bucket results in elimination of the PPV bucket.

18. The apparatus of claim 1, wherein the controller logic circuitry is to:
apply a first program voltage ($V_{PRG\_1}$) to a word line coupled to a plurality of cells;
for cells among the plurality of cells with a nominal bit line voltage $V_{BL}$, determine whether the cell has a read voltage that meets VFY, falls in the PPV bucket, or has a read voltage that is less than P-VFY;
for cells not meeting VFY,
apply an elevated second program voltage $V_{PRG\_2}=V_{PRG\_1}+\Delta V_{PRG}$ to the word line;
for cells with a read voltage less than P-VFY, apply nominal bit line voltage $V_{BL}$; and
for cells in the PPV bucket, apply a bit line voltage $V_{BL}+\Delta V$ that is above nominal bit line voltage $V_{BL}$.

19. The computing system of claim 8, wherein the logic circuitry is to:
apply a first program voltage ($V_{PRG\_1}$) to a word line coupled to a plurality of cells;
for cells among the plurality of cells with a nominal bit line voltage $V_{BL}$, determine whether the cell has a read voltage that meets VFY, falls in the PPV bucket, or has a read voltage that is less than P-VFY;
for cells not meeting VFY,
apply an elevated second program voltage $V_{PRG\_2}=V_{PRG\_1}+\Delta V_{PRG}$ to the word line;
for cells with a read voltage less than P-VFY, apply nominal bit line voltage $V_{BL}$; and
for cells in the PPV bucket, apply a bit line voltage $V_{BL}+\Delta V$ that is above nominal bit line voltage $V_{BL}$.

20. The non-transitory machine readable storage medium of claim 13, wherein the program code instructions when processed by the controller further cause the controller to:
apply a first program voltage ($V_{PRG\_1}$) to a word line coupled to a plurality of cells;
for cells among the plurality of cells with a nominal bit line voltage $V_{BL}$, determine whether the cell has a read voltage that meets VFY, falls in the PPV bucket, or has a read voltage that is less than P-VFY;
for cells not meeting VFY,
apply an elevated second program voltage $V_{PRG\_2}=V_{PRG\_1}+\Delta V_{PRG}$ to the word line;
for cells with a read voltage less than P-VFY, apply nominal bit line voltage $V_{BL}$; and
for cells in the PPV bucket, apply a bit line voltage $V_{BL}+\Delta V$ that is above nominal bit line voltage $V_{BL}$.

* * * * *